(12) United States Patent
Hunsche et al.

(10) Patent No.: US 7,564,017 B2
(45) Date of Patent: Jul. 21, 2009

(54) SYSTEM AND METHOD FOR CHARACTERIZING AERIAL IMAGE QUALITY IN A LITHOGRAPHY SYSTEM

(75) Inventors: Stefan Hunsche, Sunnyvale, CA (US); Jun Ye, Palo Alto, CA (US)

(73) Assignee: BRION Technologies, Inc., Santa Clara, CA (US)

( * ) Notice: Subject to any disclaimer, the term of this patent is extended or adjusted under 35 U.S.C. 154(b) by 426 days.

(21) Appl. No.: 11/437,587

(22) Filed: May 19, 2006

(65) Prior Publication Data
US 2006/0273242 A1 Dec. 7, 2006

Related U.S. Application Data

(60) Provisional application No. 60/686,624, filed on Jun. 3, 2005.

(51) Int. Cl.
*H01L 27/00* (2006.01)
(52) U.S. Cl. .................................. 250/208.1
(58) Field of Classification Search ............... 250/208.1
See application file for complete search history.

(56) References Cited

U.S. PATENT DOCUMENTS

| | | | |
|---|---|---|---|
| 5,631,731 | A | 5/1997 | Sogard |
| 6,563,564 | B2 | 5/2003 | de Mol et al. |
| 6,741,331 | B2 | 5/2004 | Boonman et al. |
| 6,787,789 | B2 | 9/2004 | Van Der Laan |
| 6,828,542 | B2 | 12/2004 | Ye et al. |
| 2002/0192598 | A1 * | 12/2002 | Hirayanagi ............... 430/311 |

OTHER PUBLICATIONS

A.K. Pfau et al. "A Two-Dimensional High-Resolution Stepper Image Monitor," Proc. SPIE vol. 1674, pp. 182-192 (1992).
B.J. Cheng et al. "Improve the Image Control by Correcting the Lens Heating Focus Drift," Proc. SPIE vol. 4000, pp. 818-826 (2000).
S.P. Renwick "What Makes a Coherence Curve Change?" Proc. SPIE vol. 5754, pp. 1537-1547 (2005).
S.P. Renwick "Flare and Its Effects on Imaging," Proc. SPIE vol. 5377, pp. 442-450 (2004).
S.P. Renwick et al. "Size-Dependent Flare and Its Effect on Imaging," Proc. SPIE vol. 5040, pp. 24-32 (2003).
B. La Fontaine et al. "Analysis of Flare and its Impact on Low-k1 KrF and ArF Lithography," Proc. SPIE vol. 4691, pp. 44-56 (2002).

* cited by examiner

*Primary Examiner*—Seung C Sohn
(74) *Attorney, Agent, or Firm*—Pillsbury Winthrop Shaw Pittman LLP

(57) ABSTRACT

While a high-resolution 2-dimensional image reconstruction is expected to give the maximum possible amount of information on the aerial image in a projection system, relevant information regarding image quality can be derived from a statistical evaluation of image values. Relevant statistical image data can be derived by sampling at a multitude of non-adjacent locations across a large area, rather than by scanning over many adjacent locations on a small area. Examples of the benefits of the present invention include: (1) it generally does not rely on very precise, repeatable fine alignment of the image sensor array with respect to the mask and/or the projected image; (2) a large number of individual sensor elements are utilized, and image data is generated from a large set of signal values; and (3) it can generate relevant data to assess aerial image quality in a very short data acquisition time.

22 Claims, 8 Drawing Sheets

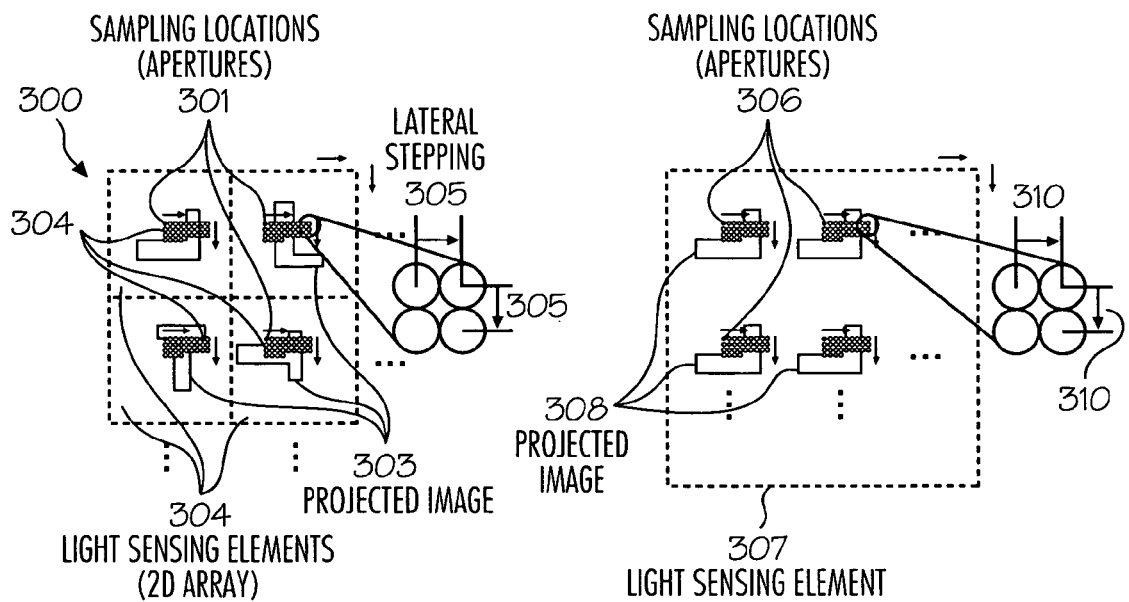
Fig. 3A *(PRIOR ART)*  Fig. 3B *(PRIOR ART)*
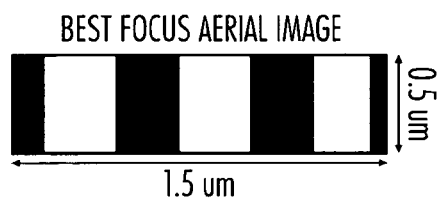
Fig. 4A
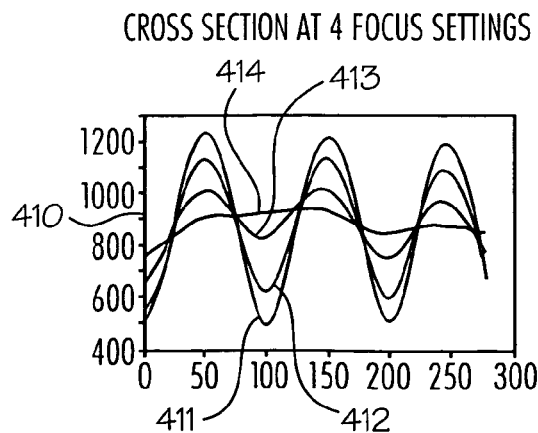
Fig. 4B
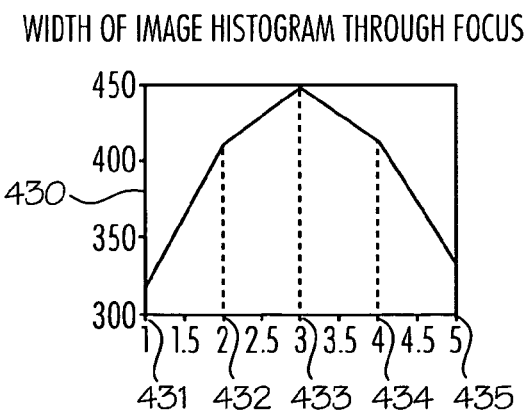
Fig. 4C

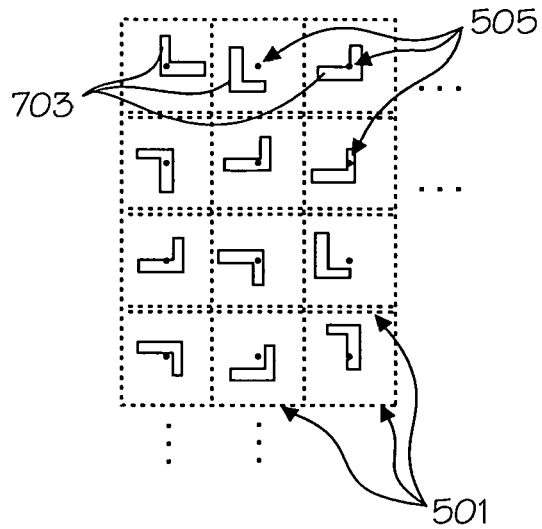
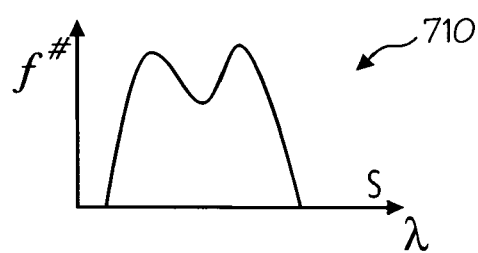
Fig. 7A  Fig. 7B
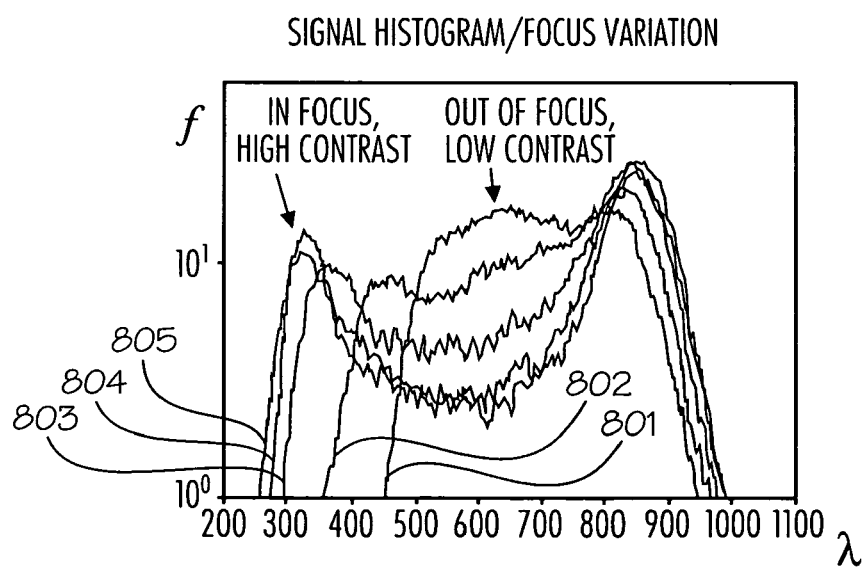
Fig. 8A

SYSTEM AND METHOD FOR CHARACTERIZING AERIAL IMAGE QUALITY IN A LITHOGRAPHY SYSTEM

CROSS-REFERENCE TO RELATED APPLICATION

This application claims the benefit of U.S. Provisional Patent Application No. 60/686,624, filed Jun. 3, 2005 entitled "Method and System for Characterizing Aerial Image Quality in a Lithographic Projection System (Pseudo-Random Aerial Image Sampling)." The subject matter of the related application is hereby incorporated by reference in its entirety.

FIELD OF THE INVENTION

This invention relates generally to optical lithography systems and more particularly to characterizing aerial image quality in a lithography system.

BACKGROUND

Optical lithography is a key technology used in manufacturing of semiconductor devices, flat panel displays, and other devices. As feature dimensions are continuously being reduced to fit more components on each device, lithography is being pushed towards and beyond the classical resolution limit of optical imaging systems. The characteristics of the aerial image that is projected from a mask onto a substrate, e.g., a semiconductor wafer, are being manipulated by a wide range of resolution enhancement techniques (RET), such as phase shifting or optical proximity correction (OPC) in order to achieve the desired results. At the same time, with shrinking device dimensions, processing margins and process windows, which determine manufacturability and yield of a process, are being squeezed. More and better diagnostics are required to keep processes in control as well as to develop and improve numerical models that predict process capabilities and enable successful implementation of RET.

It has recently been demonstrated that the aerial image in a lithographic projection system can be directly measured with high spatial resolution in situ and under conditions that exactly match the conditions used in production. An image sensor unit having resolution-enhanced sensor elements and a method of aerial image acquisition are described in U.S. Pat. No. 6,828,542, "System and Method for Lithography Process Monitoring and Control," the subject matter of which is hereby incorporated by reference in its entirety. Such an image sensor unit can be loaded onto the wafer stage of a lithographic projection system in place of a regular production semiconductor wafer and be repeatedly exposed with the projected image from a mask in the same way as a production wafer.

With reference to FIG. 1, in one embodiment of the invention disclosed in the U.S. Pat. No. 6,828,542, aerial image sensing system 100 includes lithographic equipment 10 (for example, a stepper), an image sensor unit 102, and a processor/controller 104, for example, a computer and/or data or image processing unit. Lithographic equipment 10 may include a mirror 12, a light source 14 to generate light 16 at a certain exposure wavelength, illumination optics 18, projection optics 20, and a chuck 22. Chuck 22 secures image sensor unit 102 in a fixed location using, for example, electrostatic or vacuum forces.

The optics of lithographic equipment 10 (for example, light source 14, illumination optics 18, and projection optics 20) interacts with a mask 26 to project an aerial image onto image sensor unit 102. Mask 26, in one embodiment of the invention disclosed in the U.S. Pat. No. 6,828,542, may be a product-type mask; that is, a mask used to form circuits during integrated circuit fabrication. As such, mask 26 contains the pattern to be replicated or printed on a wafer that ultimately contains the circuit design (or a portion thereof) of the integrated circuit. In this embodiment, image sensor unit 102 may be employed to evaluate the interaction between mask 26 and lithographic equipment 10 (whether production or non-production equipment) as well as characterize the performance of lithographic equipment 10 or the quality of mask 26.

In another embodiment of the invention disclosed in the U.S. Pat. No. 6,828,542, mask 26 may be a test mask that is used to inspect, characterize and/or evaluate the optical characteristics or response of lithographic equipment 10. In this regard, mask 26 may include a fixed, predetermined and/or known pattern against which the aerial image collected, sensed, sampled, measured and/or detected by image sensor unit 102 will be evaluated, measured, and/or compared. In this way, any errors or discrepancies in the aerial images may be isolated or attributed to the optical system of lithographic equipment 10 and the performance of that system may be evaluated or characterized.

With continued reference to FIG. 1, image sensor unit 102 collects, measures, senses and/or detects the aerial image produced or generated by lithographic equipment 10 in conjunction with mask 26. Image sensor unit 102 provides image data, which is representative of the aerial image, to processor/controller 104. Processor/controller 104, in response, evaluates and/or analyzes that data to inspect, characterize and/or evaluate mask 26 and/or lithographic equipment 10 (or sub-systems thereof, for example, the optical sub-system). In this regard, processor/controller 104 implements data processing and analysis algorithms to process the data from image sensor unit 102 to reconstruct a full or partial aerial image, or to extract desired information directly without reconstructing a full or partial aerial image. Such image processing may involve deconvolution or other techniques familiar to those skilled in the art.

In addition, processor/controller 104 may use the data from image sensor unit 102 to perform and evaluate critical dimension measurements, and/or conduct defect inspection, for example, by comparing the measured aerial image to a pattern design database, or perform a die-to-die inspection if there are multiple dice on the same mask. Processor/controller 104 may also implement algorithms that conduct or perform resist modeling and/or integrated circuit yield analyses.

Processor/controller 104 may be employed as a control or operator console and data/image processing device. Processor/controller 104 may store algorithms and software that process the data representative of the aerial image (received from image sensor unit 102), extract information, manage data storage, and/or interface with users/operators. Processor/controller 104 may be located near or next to lithographic equipment 10 or in another locale, which is remote from lithographic equipment 10.

It should be noted that processor/controller 104 may be a stand-alone unit, as illustrated in FIG. 1, or partially or wholly integrated in lithographic equipment 10. In this regard, suitable circuitry in lithographic equipment 10 may perform, execute and/or accomplish the functions and/or operations of processor/controller 104 (for example, evaluation and/or analysis of the data representative of the aerial image collected, measured, sensed and/or detected at the wafer plane). Thus, in one embodiment, the inspection, characterization and/or evaluation circuitry/electronics may be partially or wholly integrated into lithographic equipment 10 and, as such, this "integrated system" may determine, assess, apply and/or implement appropriate corrective measures to enhance or improve its operation and thereby improve or enhance the quality, yield, and cost of integrated circuits manufactured therein.

It should be further noted that processor/controller 104 may also be partially or wholly integrated in, or on, image sensor unit 102. In this regard, some or all of the functions and operations to be performed by processor/controller 104 may be performed, executed and/or accomplished by suitable circuitry in, or on image sensor unit 102. As such, the collection and analysis of data representative of the aerial image may be less cumbersome in that a bus may be integrated and/or fabricated on or within image sensor unit 102 to facilitate communication of data and commands to/from the circuitry used to measure, detect and/or sense the aerial image and the circuitry used to evaluate and/or analyze the data representative of the aerial image.

With reference to FIG. 2, in one embodiment of the invention disclosed in the U.S. Pat. No. 6,828,542, an image sensor array 106 of image sensor unit 102 is shown. Image sensor array 106 includes a plurality of sensor elements 200, including $200a_x$ to $200h_x$ (x=1 to 8), that measure, sense, detect and/or collect incident energy or radiation.

In those instances where the dimensions of the active areas of sensor elements 200 are too large to provide a desired or required spatial resolution, it may be necessary to limit, restrict, and/or reduce these sensor cells' active areas that are exposed. Hence, image sensor array 106 may include a patterned opaque film 204 that impedes, obstructs, absorbs, and/or blocks passage of photons or light of a given wavelength (that is, at the wavelength to be measured, sensed or detected by sensor elements 200). Opaque film 204 includes apertures 206, including $206a_x$ to $206h_x$ (x=1 to 8), so that active areas of sensor elements 200 are exposed only at apertures 206. As such, the spatial resolution of the energy measured by sensor elements 200 is enhanced or improved because the portion or area of each sensor element that is effectively exposed to and/or measures, senses, detects, and/or collects energy or radiation is limited or restricted.

Generally, sensor elements 200 as well as any resolution enhancing measures, e.g., small apertures 206 formed in a light-blocking layer on top of sensor elements 200, will be arranged on a very regular 2-dimensional grid. As also described in the U.S. Pat. No. 6,828,542, the aerial image of a projection apparatus can be sampled and reconstructed by loading image sensor unit 102 into the image plane of the projection optics, exposing image sensor unit 102, and subsequently introducing small lateral shifts in x and y directions of image sensor unit 102 relative to the aerial image before further iterated exposures. This data acquisition scheme, which resembles the operation principle of a scanning imaging microscope, is illustrated in FIG. 3A. This figure depicts schematically a two-by-two subset 300 of a larger 2D (two-dimensional) image sensor array (such as image sensor array 106 shown in FIG. 2). The black dot close to the center of each light-sensing element 302 indicates a resolution-enhancing element, e.g., a small aperture 301 that enables sufficient discrimination of the smallest spatial features in the aerial image. Also, the projected images 303 are schematically indicated as feature shapes of the aerial image that is projected onto light-sensing elements 302. Small open circles 304 indicate subsequent sampling locations that result from small, programmed lateral steps 305 in between repeated exposures of the light-sensing element 302. From these subsequent exposures and the data recorded by each individual light-sensing element 302, a small area of the projected image 303 can be reconstructed with a spatial resolution that depends on the size of apertures 301 and/or the step size 305 in between exposures. The reconstructed high-resolution image "patches" of various light-sensing elements 302 are independent so that each light-sensing element 302 may sample different, arbitrary image features. A complete reconstruction of the full mask image is, in principle, possible by capturing a sufficiently large number of exposures and by covering an area with each light-sensing element 302 that matches or exceeds the lateral light-sensing element "grid period" in x and y directions (i.e., the width and height, respectively, of each light-sensing element 302). Thus, in principle, detailed investigation of completely arbitrary mask layouts is possible, as is detection of single, isolated image defects.

However, to achieve high resolution of the reconstructed image, small lateral steps and therefore a very large number of successive exposures are required if a substantial fraction of the complete mask area is to be inspected. Typical grid periods for imaging sensor arrays are on the order of 10 um, while spatial dimensions on leading edge semiconductor layouts are below 0.1 um. Therefore, for complete "mask inspection" at high resolution, at least on the order of 10,000 exposures would be required. This requirement implies relatively long data acquisition times, during which the projection tool would be unavailable for production. In addition, certain drifts or performance changes over time may occur during data acquisition periods, for example, due to lens heating effects.

There are many situations in which it may be beneficial to assess the overall quality of the aerial image in a projection system, while it may not be required to inspect individual mask features or detect individual point defects. In such situations there is a clear need for generating relevant information in as short a time as possible in order to maximize availability of the lithography tool for production. Such situations include investigations of aerial image quality in response to effects or adjustments that are expected to result in global variations, e.g., of image contrast, or spatially slowly varying changes within the exposure field of the projection apparatus. Some examples of parameters or parameter changes that result in global image variations are focus position, focal plane tilt and shape, low-order aberrations, flare, measurements of image contrast vs. pitch, and line width. Also, in process development or design rule verification, investigating image quality of particular features on average may provide more useful information than assessing an individual instance of a particular feature.

Another challenge may arise from the fact that the smallest aerial image features in a leading-edge lithographic projection system are often smaller than the wavelength used to project the image from a mask onto a wafer. Resolving such small features with a scanning aperture generally requires an aperture size smaller or at least comparable to that of the smallest feature sizes. The optical intensity transmitted through an aperture comparable or smaller than the wavelength of the radiation is typically very low and may limit the signal-to-noise ratio (SNR) of the detected signal. In order to improve the SNR, an aerial image sensor that had an array of many apertures formed on a single photo detector (i.e., a photodiode) was manufactured in a prior art system; this aerial image sensor was also stepped sequentially across the wafer plane in a lithographic projection system in order to reconstruct a high-resolution aerial image. See "A Two-Dimensional High-Resolution Stepper Image Monitor," A. K. Pfau et al., Proc. SPIE Vol. 1674 (1992). FIG. 3B illustrates this prior art system. Here, multiple apertures 306 are on one light-sensing element 307 for capturing the projected images

308. Small open circles 309 indicate subsequent sampling locations that result from small, programmed lateral steps 310 in between repeated exposures of the single light-sensing element 307.

Since the signal measured by the photo detector is the sum of intensities transmitted through the individual apertures, a requirement for image reconstruction is to provide an image with regularly spaced, identical, and repeated features on a grid that exactly matches the aperture grid. While improving the SNR, this arrangement puts very stringent limitations on the mask design layout and essentially prevents inspection of arbitrary, production-type photo masks.

Both methods illustrated in FIGS. 3A and 3B rely on stepping apertures across the projected image at very well-controlled, known positions in order to reconstruct an undistorted high-resolution image. While overlay accuracies in the nanometer range are currently achieved in high-end lithographic projection tools, the requirement for very precise and repeatable alignment of the sensor with respect to the projected image over a potentially very large number of subsequent exposures is clearly a technical challenge, and any imperfections in this process may introduce additional noise or distortions to the reconstructed aerial image.

SUMMARY

While a high-resolution 2-dimensional image reconstruction is expected to give the maximum possible amount of information on the aerial image in a projection system, relevant information regarding image quality can be derived from a statistical evaluation of image values. Moreover, relevant statistical image data can be derived by sampling at a multitude of non-adjacent locations across a large area, rather than by scanning over many adjacent locations on a small area, provided that the image has a very repetitive structure of many repeated, equivalent or self-similar features. The latter is often the case for designs of semiconductor memory devices, and can easily be implemented in suitable test masks.

One advantage of the invention is that it generally does not rely on very precise, repeatable fine alignment of the image sensor array with respect to the mask and/or the projected image, which is a stringent requirement of high-resolution scanning imaging. Another advantage of the invention is that a large number of individual image sensor elements are utilized and image data is generated from a large set of signal values. This generally results in an averaging effect that improves the SNR of derived image information.

Yet another advantage of the invention is the ability to generate relevant data to assess aerial image quality in a very short data acquisition time, compared to the high-resolution image reconstruction described in prior art.

A method of the invention comprises measuring light intensity, using an image sensor array, at a number of samples of statistically-determined, non-adjacent locations within an aerial image produced by a lithography system without obtaining a number of measurements sufficient to reconstruct a complete feature of the aerial image, and using the samples of measured light intensity to determine a characteristic representative of the quality of the entire aerial image.

A system of the invention comprises an image sensor array capable of being loaded into a lithography tool, the lithography tool configured to project an aerial image onto the image sensor array, a data storage module capable of receiving and storing measurements of light intensity from the image sensor array, and an image characterization module configured to receive stored measurements of light intensity from the data storage module. The image characterization module is also configured to determine a characteristic representative of the quality of the entire aerial image using measurements of light signal intensity measured by the image sensor array at a statistically-determined sample of non-adjacent locations within the aerial image and to determine the characteristic representative of the quality of the entire aerial image using a fewer number of measurements than would be required to reconstruct a complete feature of the aerial image.

BRIEF DESCRIPTION OF THE DRAWINGS

FIG. 3A shows the data acquisition principles for the aerial image sensing system of FIG. 1;

FIG. 3B shows the data acquisition principles for another prior art aerial image sensing system;

FIG. 4A is a reconstructed aerial image measured by an aerial image sensor unit;

FIG. 4B is a cross section of the image of FIG. 4A at different focus settings;

FIG. 4C is a standard variation of image value distribution (histogram) through focus for the image of FIG. 4A;

FIG. 7A is a diagram of one embodiment of an image sensor array, according to the invention;

FIG. 7B is a histogram of measured intensity values, according to the invention;

FIG. 8A shows histograms of measurements obtained from 5,000 image sensor elements in an aerial image sensor array, according to the invention;

FIG. 10 is a diagram of one embodiment of an image sensor array, according to the invention a;

DETAILED DESCRIPTION OF THE INVENTION

Figure 1:
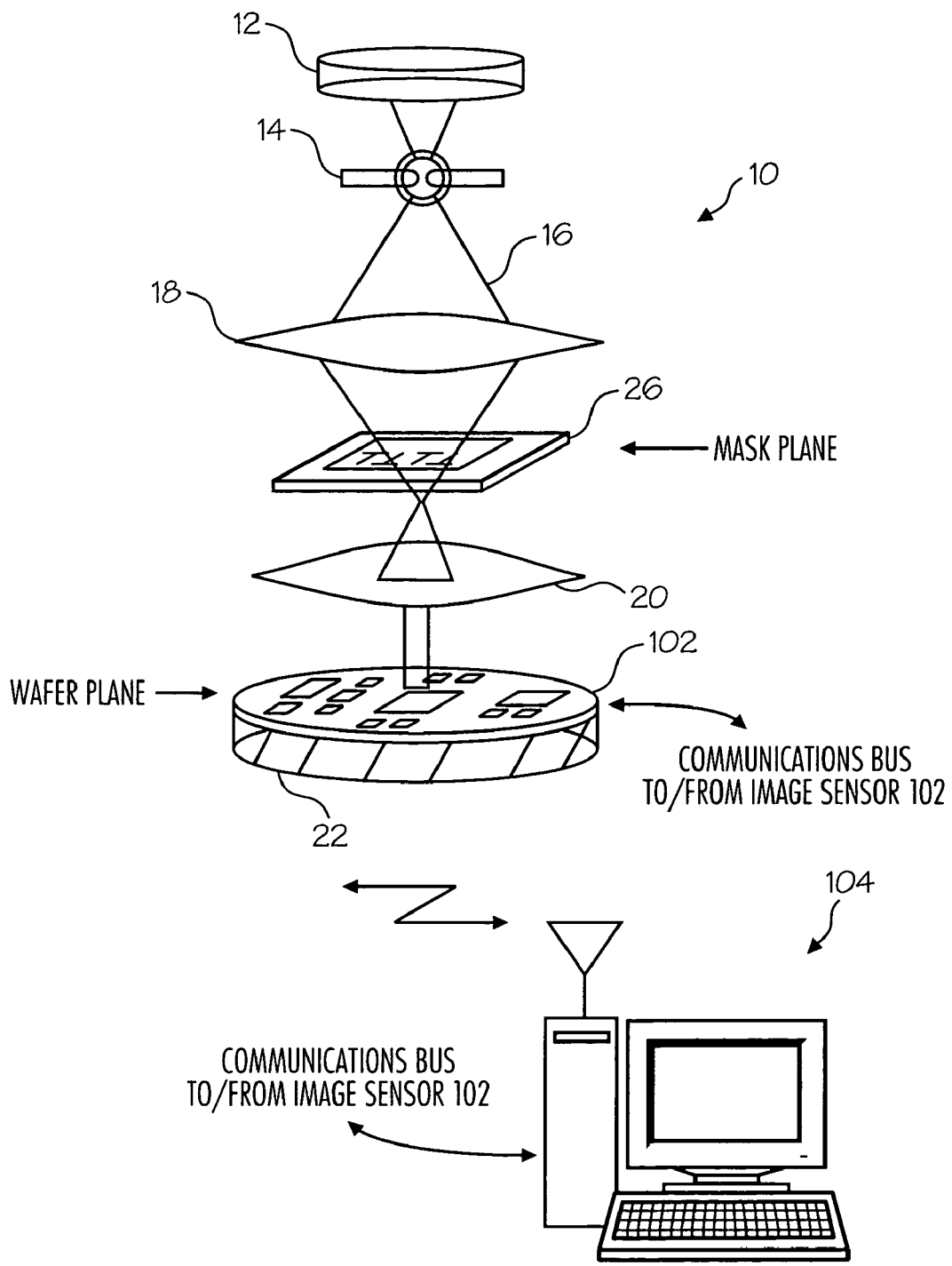
FIG. 1 is a block diagram of a prior art aerial image sensing system.
Figure 2:
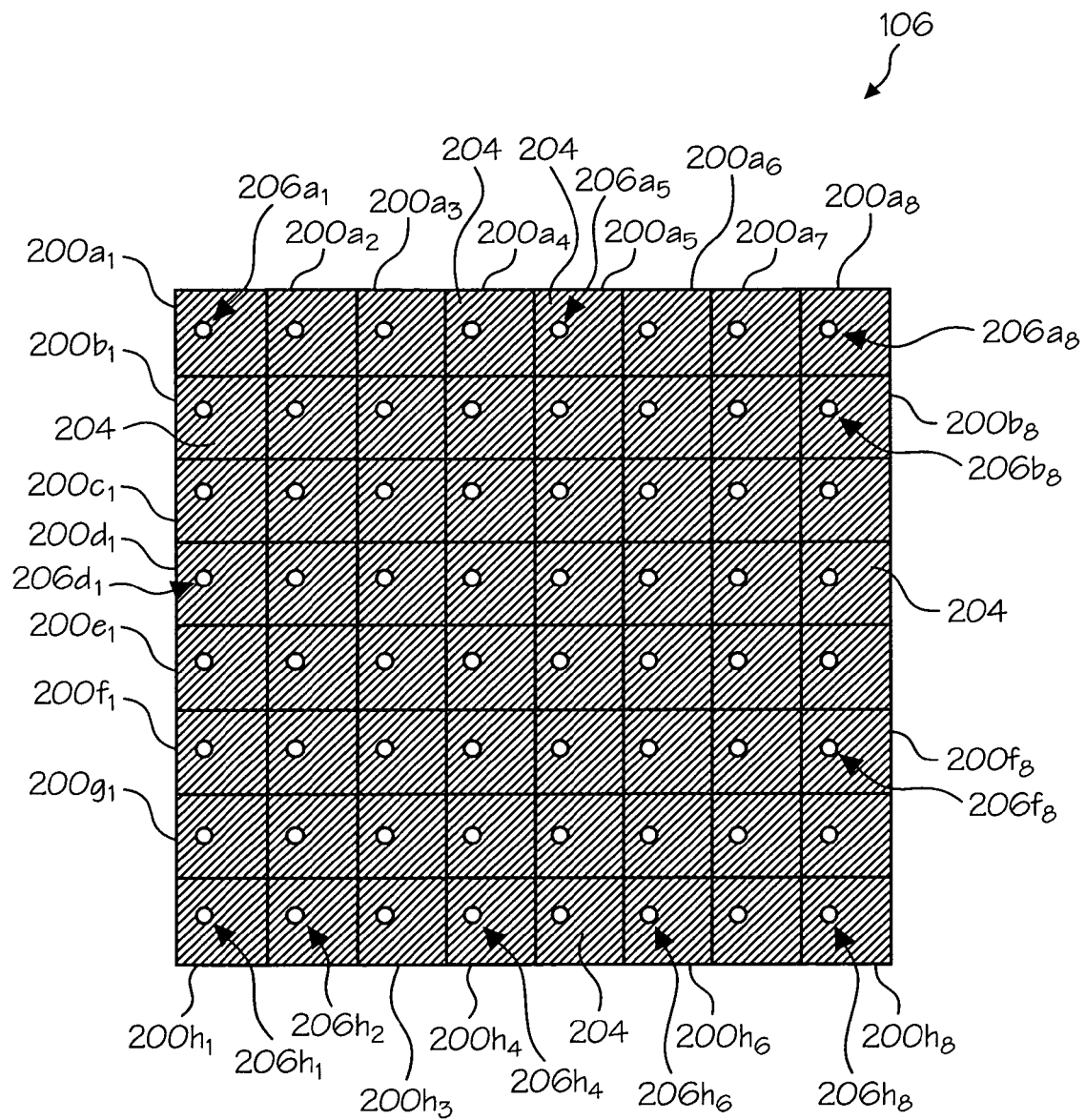
FIG. 2 is a two-dimensional (top view) schematic representation of a prior art sensor array, in conjunction with a selectively patterned, shaped, and/or etched opaque film.

FIG. 4A shows a small part of a reconstructed aerial image measured using an image sensor unit according to the U.S. Pat. No. 6,828,542 and the technique illustrated in FIG. 3A. The high resolution image "patch" is derived from a single sensor element of a larger array that has been successively stepped through the image projected at the wafer plane of a lithographic exposure tool, covering an area of 1.5×0.5 um$^2$.

The part of the image shown in FIG. 4A is projected from a line/space pattern on a test mask, and for illustrative purposes the transitions between light and dark areas in the image have been simplified. FIG. 4B depicts intensity measurements 410 of several such images taken at different focus settings. Clearly, the measured image contrast, $C=(I_{max}-I_{min})/(I_{max}+I_{min})$, varies with focus settings 411 to 414, and information from the aerial images can be utilized to determine the "best focus" setting, by analyzing, e.g., the maximum and minimum signal values of the image or the image slope at the edges between dark and bright areas. Alternatively, a histogram of the intensity values may be constructed, and the width or other parameters of this histogram can be analyzed to determine a characteristic representative of image quality. FIG. 4C shows the variation of the width (standard deviation) 430 of the distribution of image signal levels for 5 high-resolution aerial images similar to FIG. 4A, taken at 5 different focus settings 431 to 435. Clearly, as expected, the width 430 of the signal distribution is a good indicator of image contrast and can be utilized to determine the best focus position. Alternatively, any changes of image contrast due to other effects than defocus, e.g., aberrations, flare, etc. may be detected by measuring the width of an image signal histogram or other parameters of the image statistics.

FIG. 5 shows one embodiment of a system for characterizing quality of an aerial image, including an image sensor unit 520 and a processor/controller 530. Processor/controller 530 includes a data storage module 532 and an image characterization module 534. Processor/controller 530 is configured to communicate with image sensor unit 520 via a communication link 540. Processor/controller 530 may be external to image sensor unit 520 or may be integrated with image sensor unit 520. Image sensor unit 520 includes an image sensor array 500. Image sensor array 500 includes light-sensing elements 501 on a regular grid used in conjunction with a mask having a regular pattern formed by repetitions of a basic feature 503 on a regular grid. Features 503 in FIG. 5 are part of an aerial image projected onto image sensor array 500 by a lithography tool. Image sensor array 500 measures the intensity of the aerial image and sends the measurements of light intensity to data storage module 532. Image characterization module 534 uses the measurements of light intensity stored in data storage module 532 to determine a characteristic representative of the quality of the entire aerial image.

Figures 5A, 5B:
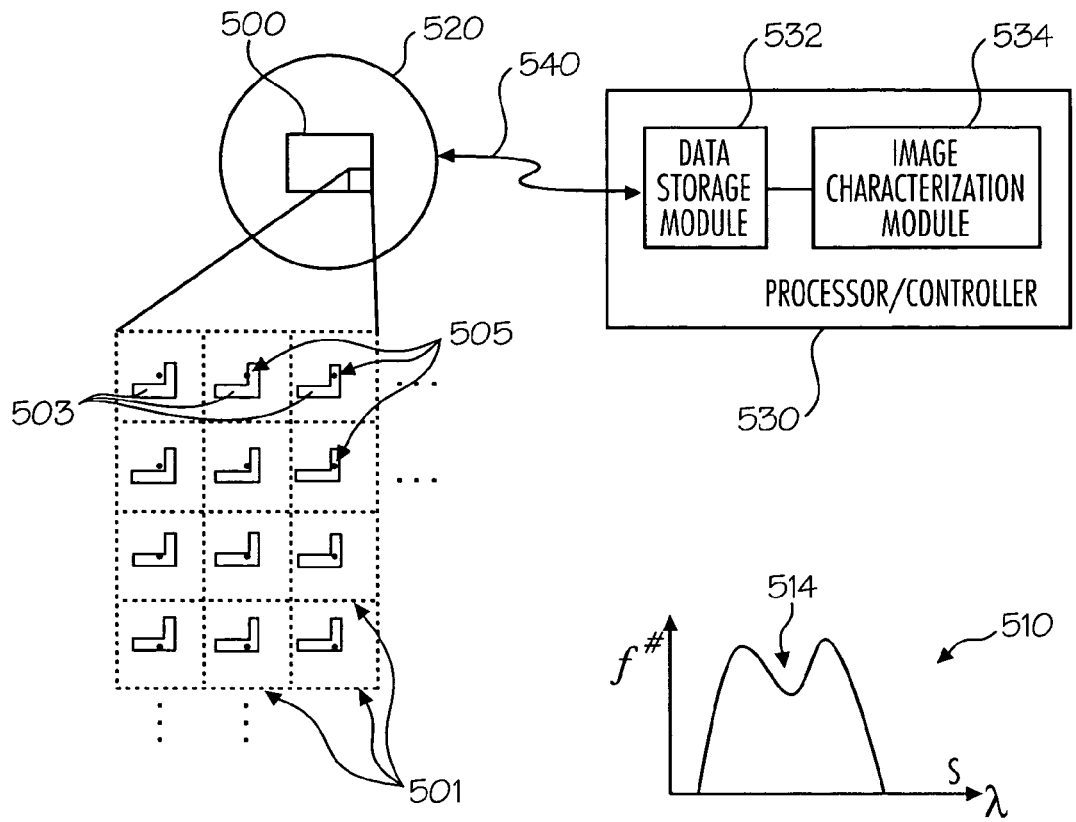
FIG. 5A is a diagram of one embodiment of a system for characterizing quality of an aerial image, according to the invention.
FIG. 5B is a histogram of measured intensity values, according to the invention.

Light-sensing elements 501 are designed to provide intrinsic spatial resolution that is sufficient to resolve details of features 503. Sufficient spatial resolution to resolve feature sizes that are typical of semiconductor device features can be achieved, e.g., by small apertures 505 in a light blocking layer formed on light-sensing elements 501. The location of each aperture 505 is a sampling location within the aerial image projected onto image sensor array 500. This arrangement resembles FIG. 3A in that it utilizes an image sensor array 500 with many individual light-sensing elements 501. It resembles the arrangement in FIG. 3B in that both apertures 505 and identical, repeated features 503 are arranged on very regular grids. Unlike that in FIG. 3B, the match of the aperture grid period and the mask pattern grid period is not perfect, and many light-sensing elements 501 are read out individually. Comparing one cell of either grid to an adjacent one, there is a small lateral offset of each light sensing element 501 (and its associated aperture 505) relative to the basic, repeated feature 503 in the projected image. This offset can be introduced by designing the mask pattern grid with a slightly different period than the sensor image element grid, or it can be introduced by a small rotational misalignment between a mask and an image element grid having precisely the same period. It is well known that under these conditions, if the increasing offset between adjacent cells changes slowly enough, a single "image frame" read out from image sensor array 500 will show a Moiré pattern that essentially contains one or more up-sampled average image(s) of features 503. Therefore, a histogram of signal values from image sensor array 500, obtained in a single exposure, will contain information on the average image contrast. For illustration, a schematic histogram 510 of measured intensity values at different wavelengths generated by image characterization module 534 is shown in FIG. 5B, assuming a mask feature having comparable amounts of "bright" and "dark" areas and good contrast, i.e., a steep image slope between dark and bright. Histogram 510 has a double-peaked structure, indicating average bright and dark signal values, separated by a dip 514 due to relatively few samples falling on transitions between dark and bright, i.e., edges of the image feature. The particular height of dip 514 in histogram 510 may be further analyzed and correlated to the image edge slope. It is clear that any changes in image contrast due to defocus, aberrations, or flare will be detectable as changes to the width and shape of histogram 510.

Generating an actual up-sampled image that provides a faithful representation of a mask feature would require both the grid of image sensor array 500 and the mask grid to be manufactured with very high accuracy and to be mutually aligned with very high precision. Any imperfections in the regularity of either grid could seriously distort the measured image. However, if a sufficiently large number of sampling locations is available, any statistical assessment of image quality is largely unaffected by positional imperfections arising from grid irregularity or overlay alignment errors.

Figures 6A, 6B:
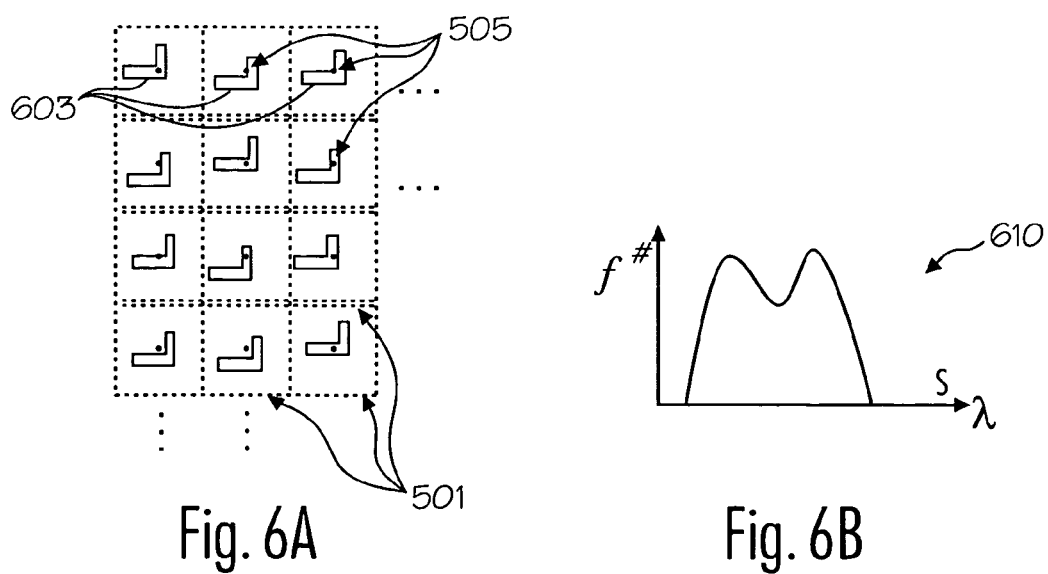
FIG. 6A is a diagram of one embodiment of an image sensor array, according to the invention.
FIG. 6B is a histogram of measured intensity values, according to the invention.

In fact, to derive statistical image information, there is no requirement for a regular shift between apertures 505 and aerial image features 503 as shown in FIG. 5A, and no need for any kind of actual image reconstruction. If sampling locations cover the area of an image feature of interest randomly and uniformly, the statistics of measured intensity values are expected to be identical to those of a reconstructed image if the density of sampling locations is high enough in either case. Therefore, image statistics may be derived in a configuration as schematically illustrated in FIG. 6A. Image sensor array 500 and a mask having identical, repeated features 603 are used similar to the concept of FIG. 5A; however, the cell-to-cell shifts in relative alignment of light-sensing elements 501 and basic mask features 603 are now random or, more precisely, pseudo-random. Clearly, once a mask and an image sensor array are fabricated, and they are aligned with respect to each other in any way, there cannot be an actually random shift between adjacent unit cells. In the present context, "pseudo-random" is defined by the following criteria: a) there is no intended regular order to the lateral shifts between sampling locations and image features and b) the average density of sampling locations over the unit area of a generalized mask feature is uniform for the set of sampling locations from which image statistics will be derived. A possible way of implementing this on a specifically designed test mask is to locate repeated, identical image features in "feature" cells on a grid matching the image sensor array periodicity but having irregular lateral offsets within each unit cell. These irregular offsets may, e.g., be derived from an actual or pseudo-random number generator. A more straightforward implementation would simply have sufficiently large mismatch and misalignment between the mask and image sensor grids to preclude formation of a Moiré pattern and to guarantee uniform coverage of the basic image features 603 by sampling locations.

In either case, an image frame read out from image sensor array 500 would appear essentially random. However, image sensor elements 501 will statistically sample dark, bright, and transition areas of the image feature, and therefore, if a sufficiently large number of sampling locations are considered, a histogram of measured values will essentially be identical to a histogram derived from an actual up-sampled or scanned image. In other words, the statistics of data values will be unaffected by the distinction between regular and random sampling. Histogram 610 in FIG. 6B is the same as histogram 510 in FIG. 5B and histogram 610 again reveals bright and dark levels as well as image contrast. Clearly again, changes in image contrast can be detected as changes to the sample value statistics. A simple test of sufficient uniformity of the sampling distribution would introduce small lateral offsets between adjacent exposures of image sensor array 500, which would not be expected to introduce significant changes to the signal value distribution.

While the configuration in FIG. 6A assumed identical image features to be repeated on the mask, FIG. 7A schematically illustrates a further generalization. Here, the pattern repeated on the mask consists of basic features 703 with random or pseudo-random offsets relative to apertures 505, as well as random or pseudo-random orientations. Moreover, the mask pattern may consist of features that are self-similar, in having, e.g., comparable fill factor or line widths, but are not required to be exactly identical replicas. This situation may be encountered with an actual production mask where the basic feature may, e.g., be a memory cell or another often-repeated functional subunit used in integrated circuit designs. As in the previous configurations, if a sufficiently large number of image sensor elements 501 are considered to ensure uniform statistical coverage of the pattern "cells" (one cell containing one basic feature), a histogram 710 of measured signal values generated by image characterization module 534 will be essentially identical to a histogram derived from high-resolution imaging of the mask patterns and contain statistical information on the overall, average image quality. Again, changes to the histogram can be analyzed and utilized to measure image contrast or detect possible changes to it.

Figure 8B:
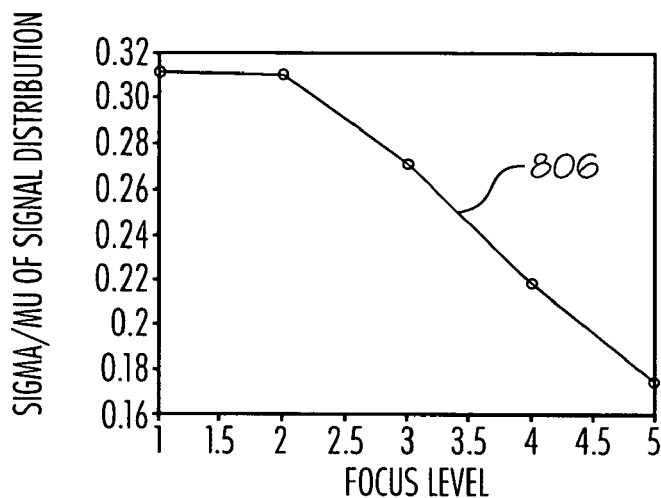
FIG. 8B is a measured width (standard deviation) of signal value distribution vs. focus level setting.

This method is demonstrated in FIG. 8A. Image sensor unit 520 having image sensor array 500 with apertures 505 formed over each image sensor element 501 was loaded onto a commercial lithography scanner (lambda=193 nm, Na=0.75, sigma=0.85) and exposed several times with the aerial image from a photo mask having a regularly tiled pattern of 500 nm wide (image coordinates at the wafer level) dark bars in horizontal and vertical orientations on a bright background. No efforts were made to achieve any particular alignment between apertures 505 and the aerial image. An area of 2.2 mm×0.2 mm of image sensor array 500 was read out and analyzed, providing approximately 5,000 samples. Data was acquired at 5 different focus settings of the scanner, and for each focus setting 10 subsequent exposures were taken for averaging. Plotted in FIG. 8A are histograms of the measured intensity values corresponding to the 5 different focus positions, where each histogram is averaged from 10 subsequent exposures. Clearly, at best focus, the width of histogram 805 is maximized while it shows a bimodal structure, i.e., well separated dark and bright image levels. Moving out of focus, the histograms significantly narrow and start to peak at an intermediate average level, indicating significant loss of aerial image contrast. FIG. 8B shows a plot 806 of how the width of the distribution varies with focus position. From this plot 806 a best focus position as well as depth of focus can be easily defined and determined.

In this example, the total exposure tool time required for data acquisition is approximately 20 seconds. On the other hand, capturing high-resolution images as the one shown in FIG. 4 would typically require about 10-30 minutes, depending on the exact image area coverage. If inspection of individual aerial image features is not essential, and assessing global image quality or changes thereof may provide sufficient information—as for example in tool monitoring—statistical sampling of the aerial image is a preferred method of generating such an assessment in order to maximize tool availability for production use.

Figure 9:
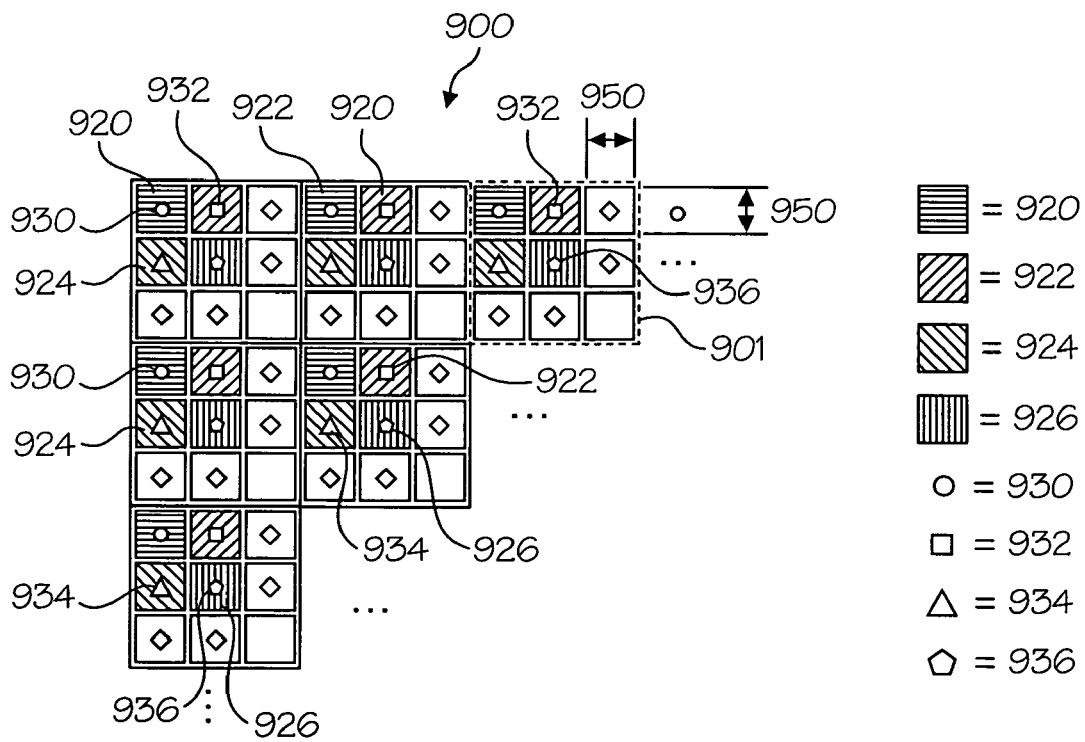
FIG. 9 is a diagram of one embodiment of an image sensor array, according to the invention.

The method described herein is not restricted to investigating any particular type of mask feature, or a single feature per mask. FIG. 9 shows a test mask layout 900 that interleaves several arrays of different test features (e.g., 920, 922, 924, and 926) grouped in unit cells 901. Such test mask layout 900 is overlaid by several interleaved grids of sampling locations, e.g., 930, 932, 934, and 936. The grid period of test features within one mask unit cell 901, or the spacing of unit cells 901, need to be matched to that of the grid of image sensor elements. In exposing the image sensor elements, sufficient overlay alignment accuracy is required to place the grid of image sensor elements on the desired grid of test features (e.g., 920, 922, 924, and 926). This will typically require alignment tolerances on the order of one or a few microns, which are feasible using the alignment techniques available on an exposure tool and corresponding alignment marks formed on the image sensor unit.

For illustration only, in FIG. 9, different test features (e.g., 920, 922, 924, and 926) are grouped within a three-by-three unit cell 901, which is then repeated over the mask. In order to study one particular test feature, a grid of image sensor elements is created in a sensor array, which is oriented and aligned with respect to the mask in order to fall on a test feature grid of interest, which may consist of, e.g., all features 920 in different unit cells 901. In the example pictured in FIG. 9, the image sensor elements on sampling location grid 930 would then generate statistical information on the aerial image of the horizontal line pattern 920. To investigate a different pattern type, for example, image sensor elements on another sampling location grid 932 would acquire aerial image data of the diagonal line pattern 922.

Each additional sampling location grid may be realized by physically shifting the image sensor array by the lateral offset between pattern types, i.e., by a multiple of the "feature cell" size 950, and sequential exposure. Alternatively, several interleaved grids of image sensor elements can be realized by a logical separation of the image sensor array into interleaved groups of image sensor elements during data processing. The latter method enables a simultaneous assessment of image quality on several different pattern types from a single exposure. As schematically depicted in FIG. 9, this may involve patterns with varying orientation of varying feature size. Clearly, with a largely regular arrangement as shown in FIG. 9, some care must be taken to ensure uniform coverage of each feature by sampling locations of each sampling location grid. This may be guaranteed by pseudo-random lateral shifts of each pattern feature within the feature cells.

Figure 10:
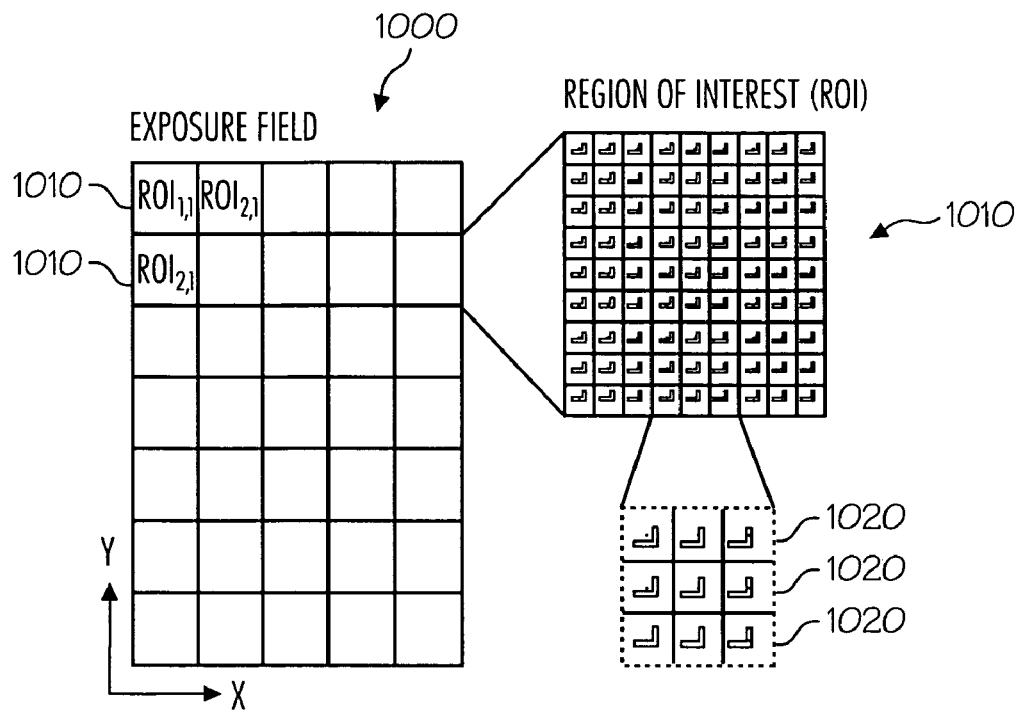

A different method of accommodating several different pattern types is illustrated in FIG. 10. Nowadays, multi-mega pixel image sensor arrays having on the order of 10 million sensor elements are available. These may cover the complete exposure field size of a lithography projection system, which typically extends over 26×33 $mm^2$ on most current tools. Such an image sensor array can be integrated into an aerial image sensor unit and provide a huge number of aerial image sampling locations. Typically on the order of 10,000 to 100, 000 sampling points may be required to provide sufficiently good image statistics for the type of analysis discussed here. As has been shown in FIG. 8, relevant information can be obtained from a relatively small sub-region of a large image sensor array, e.g., on the order of 1×1 mm². Therefore a large image sensor array can be logically subdivided into "regions of interest" (ROI), as shown in FIG. 10, and an image quality assessment can be performed individually for each ROI. The left side of FIG. 10 illustrates schematically an image sensor array 1000 matched to the size of a lithography tool's exposure field size. Image sensor array 1000 is logically subdivided into smaller ROIs 1010, and each ROI 1010 includes a predetermined number of image sensor elements 1020. Within each of ROIs 1010, a particular pattern or image feature may be repeated, in order to enable complete sampling of the particular feature.

Using an image sensor array 1000 with, e.g., 9 um spacing between image sensor elements 1020, and assuming, for illustration, an ROI 1010 size of 1×1 mm², each ROI 1010 would provide approximately 12,000 sampling locations, which is sufficient to provide good statistical coverage of an aerial image feature, while more than 850 ROIs 1010 can be placed within the full mask area. If more data points were required, there is a straightforward trade-off between ROI 1010 size, the number of different features accommodated on the mask layout, and the number of exposures that are captured. For example, a smaller ROI 1010 size that contains fewer features inside one ROI 1010 can be used with multiple exposures with a lateral shift from each other to gain back the number of sampling locations. The smaller ROI 1010 size allows a larger number of data points within the full mask area, e.g., for determination of an across-field distribution of image quality, and hence allows more types of aerial image features to be placed on the mask layout.

By subdividing the exposure area into ROIs 1010 and populating several ROIs 1010 that are distributed across the field, it is also possible to map global variations in image quality across the exposure field. For example, we can populate a 10×10 sub-array of a full ROI array (e.g., populate every third ROI, in x and y directions, inside the full ROI array) with the same feature, and each individual ROI can give a statistical analysis of a certain parameter, then a 10×10 global variation of that parameter across the exposure field can be mapped. These global variations may arise as a result of flare, lens aberrations, or mask non-uniformity. For example, it is possible to map the shape of the scanner's focal plane or changes to this plane resulting from certain dynamic adjustments applied to the lens. See U.S. Pat. No. 6,741,331, "Lithographic Apparatus with Improved Exposure Area Focus, Device Manufacturing Method, and Device Manufactured Thereby," for examples of dynamic adjustments to the focal plane of a lithographic exposure tool.

The method may also be used to directly detect changes in image contrast on a suitable test feature arising, e.g., from flare or stray light and the variation of such changes over the exposure field. The size and shape of ROIs can be easily adjusted during the design or analysis phase in order to adjust to certain spatial frequencies or directional dependencies. For example, if it is known a priori that a certain parameter will vary predominantly along the "slit" direction of a scanning exposure tool, ROI's may be rectangles with a long axis in the scan direction and a short axis along the slit direction in order to average along the scan, while providing spatial resolution in the slit direction.

Furthermore, statistical image sampling and analysis can also be applied to actual production-type masks, where the layout of logical ROIs on the image sensor array may be generally matched to the mask layout, e.g., in order to capture certain areas having particular, repeated self-similar features, such as memory cells or contact holes.

The example shown in FIG. 8 represents a purely "differential" measurement mode, where changes to a characteristic representative of image quality are observed without a calibration that would allow extracting absolute characteristic values. For some applications, it will be beneficial to express intensity signal values in relative terms, for example relative to a full exposure dose "white" level, and corrected for any possible background signal offset, possible gain or sensitivity differences between image sensor elements and any possible overall changes of sensor or detection electronics. Such a calibration can be achieved in situ, i.e., in an exposure tool immediately preceding, following, or interleaved with aerial image data acquisition, by programming a number of blank exposures a) without illumination in order to detect background/offset signal levels $C_B$, and b) with blank uniform illumination, e.g., without any mask to determine "white" signal levels $C_W$. Alternatively to the latter, one defined feature type in a test structure mask grid according to FIG. 9 may be "uniform bright," and used for white level calibration.

Once $C_B$ and $C_W$ are determined, aerial image data can be easily scaled for an absolute quantification of sample values. This calibration procedure may be performed individually for each single image sensor element, or collectively for averages from certain subsets of image sensor elements, e.g., within one of the ROIs illustrated in FIG. 10.

While the primary objective of such a calibration step will typically be the elimination of sensor-related variations in signal level, an in-situ white level measurement could also suppress certain scanner-related signal variations, notably illumination non-uniformity. Depending on the objective of an application, such a suppression of scanner-related information may or may not be desirable. If it is not, or otherwise information on such scanner characteristics is needed, several sequential calibration (e.g., white level) measurements may be performed with different sensor orientations or lateral shifts. Then, scanner and sensor-related non-uniformities may be characterized, distinguished or eliminated separately by averaging or cross-calibration between image sensor elements.

An alternative to calibrating every single image sensor element in order to generate quantitative data may utilize variations in the responsivity of image sensor elements in the image sensor array for correlation-based analysis. Such variations may occur as random fluctuations or as a result of intentional parameter variations, e.g., of aperture size in case of image sensor elements having an overlying resolution enhancing aperture. As one example, if it is known that a certain group of image sensor elements will sample equivalent points of the aerial image, recorded signal values can be evaluated as a function of calibration values, such as white level. Assume for example that a certain selection of apertures is known to fall on nominally dark areas of a mask layout, and that there is a noticeable variation of aperture diameters. In certain mask types, such as attenuated phase shift masks, the nominal "dark" level is not completely free of light, but has a background level of typically 6% plus some amount of stray light. In order to measure the actual background light level, it is possible to sample the image at nominally dark areas and plot the signal level as a function of white level reference. If there are sensor-to-sensor variations in responsivity, while the response is linear, the plotted values should fall on a straight line that can easily be fitted by linear regression. The slope of this line will correspond to the average measured dark level, and will be independent of any potential systematic signal level offsets between dark and white measurements. Therefore, this method would be somewhat more robust than determining the relative dark level by normalizing each sensor element's signal, and then calculating the average of these normalized values. The particular measurement described here would be sensitive to background light due to both mask transmission and stray light (flare).

Other intentional variations of aperture or other image sensor array parameters are possible to optimize the image sensor array's response to particular patterns, polarization and so on. As an example, linear slit apertures may be used in a variety of orientations. These may provide good spatial resolution in a single direction while having larger throughput than circular pin holes, for the improved SNR. See U.S. Pat. No. 5,631,731, "Method and Apparatus for Aerial Image Analyzer." Horizontal or vertical slit apertures may, e.g., be utilized as optimized detectors of image contrast in horizontal or vertical line/space patterns. While a 2-D image reconstruction from such apertures would be rather involved, statistical analysis of sample histograms or image contrast will be straightforward. In other words, statistical sampling seems much better suited to using such anisotropic apertures than scanning image reconstruction.

Figure 11:
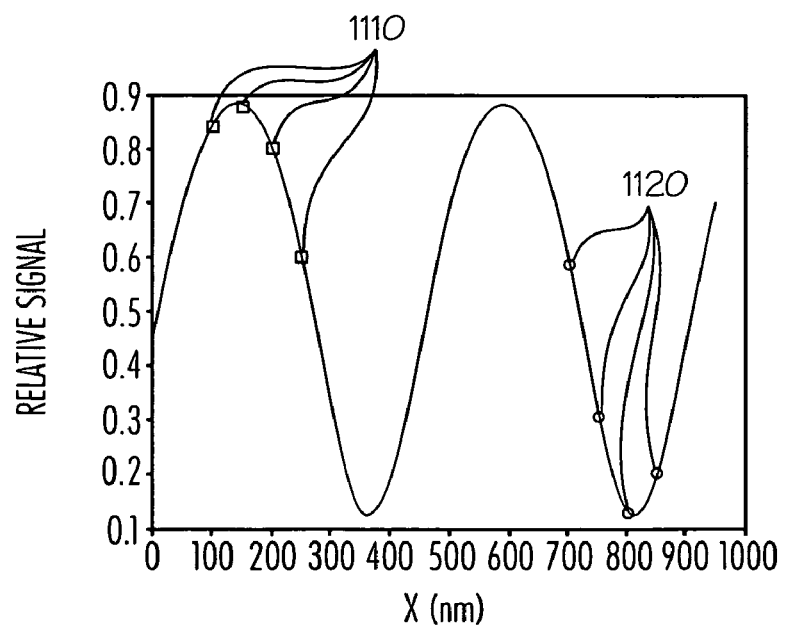
FIG. 11 shows one embodiment of a semi-deterministic sampling technique, according to the invention.

Analyzing a randomly sampled image histogram as shown by the example in FIG. 8 does not inherently make use of a priori information at which location on a particular test structure any particular sample has been obtained. It is inferred from the histogram that samples from the low end of the distribution stem from dark areas of the feature, and conversely that the high end of the distribution corresponds to bright areas of the feature. If a significant variation of sensor response from image sensor element to image sensor element exists (an effect known as pixel response non-uniformity), the histogram will be convolved with the distribution of image sensor element responsivities, leading to a broader distribution and some added uncertainty or error on, e.g., contrast analysis. This can be improved by calibration of each image sensor element as described above. A further alternative is the following method: In most applications of statistical sampling as discussed here, there will be a priori information available, e.g., from the mask design on the type of mask feature that will be sampled by a group of image sensor elements. For example, by a test mask layout similar to FIG. 9, each grid of image sensor elements is overlaid on a particular feature type. Similarly, in production masks, layout information is available as a design file, from which a classification of pattern types may be derived. Corresponding to the pattern type a number of consecutive aerial image samples with small, lateral offsets in between exposures can be captured. This stepping is similar to the data acquisition for image reconstruction; however, a significantly smaller number of subsequent samples are taken. For example if the feature of interest were a horizontal line/space pattern, 3 or 4 samples with several tens of nanometer vertical offsets may be acquired. Interpolation or curve fitting may then be used for preselected groups of samples for further analysis. In particular, one may bin samples into ones that fall around a maximum or minimum of an image feature (the value of which could be reliably determined by fitting/interpolation), or around any particular signal level. This method is illustrated in FIG. 11 showing a horizontal cross section through the aerial image of a vertical line pattern with 450 nm pitch. The two groups of four subsequent samples indicated by squares 1110 and circles 1120, respectively, represent image samples that happen to fall around a minimum or a maximum of the pattern (which will be repeated on the mask as discussed previously). Clearly, interpolation between the samples in each group, e.g., by fitting a second-order polynomial or another suitable curve form will result in a more accurate determination of the minimum and maximum value than any individual sample value by itself. Therefore, this method should allow a very precise determination of image parameters, including contrast and edge slope.

The basic methods outlined above are very general and provide significant flexibility to be applied to a very wide range of monitoring, tracking, or characterization applications related to lithographic projection systems and processes. This flexibility arises from a) a multitude of possible data analysis approaches that can be applied to the statistically sampled data, b) a multitude of possible data acquisition schedules that may be matched to a particular problem, and c) the freedom to design a wide range of test mask layouts that enable extraction of particular, targeted system parameters.

Investigating or monitoring the characteristics of a lithographic projection system will typically involve measuring image characteristics as a function of other parameters along various dimensions. As a typical example one can measure image contrast, maximum, minimum, and average image intensity values as a function of pitch on a line/space pattern, or a comparison of the image quality or best focus position between structures having different orientations, e.g., horizontal and vertical or +/−45 degrees. Some possible applications are discussed in the following; for the most part, these examples may be seen as building blocks that can be combined in various ways in order to tailor an actual application towards a specific problem statement.

The basic feasibility of statistical sampling to detect best focus by finding maximum image contrast has been demonstrated in FIG. 8. Combining this with an ROI-based sampling approach as described above (FIG. 10) will yield average best focus at a number of test areas across the exposure field. These can be interpolated to present a map that contains any variations of the projection system's focal plane that (are expected to) occur with relatively low spatial frequencies across the field.

In particular, in "differential" measurement mode, changes to the focal plane shape may be detected almost in "real time," since only a few exposures are necessary to characterize a focal plane map using ROIs and statistical sampling. Such changes to the focal plane location and shape may occur as a result of adjustments applied to the projection optics of the lithography tool or other changes of the optics over time. Some state-of-the-art exposure tools offer dynamic adjustments of the focal plane shape to compensate for, e.g., wafer topography or other non-uniformities that may be present across the exposure area. See U.S. Pat. No. 6,741,331. Focal plane mapping using an image sensor array and statistical sampling may help characterize and verify the operation of such adjustment methods.

Other changes to the optics may occur over time, either over long periods due to component aging, or over relatively short time periods as a result of warming-up effects such as lens heating, which typically appears to have several characteristic time scales. See U.S. Pat. No. 6,563,564, "Method of Operating An Optical Imaging System, Lithographic Projection Apparatus, Device Manufacturing Method, And Device Manufactured Thereby." Being able to generate a full focal plane map in real time would enable a full characterization of such effects, as well as verification of algorithms to compensate these by lens adjustments, which has proven to be a challenge in the past. See "Improve the Image Control by Correcting the Lens Heating Focus Drift," B. J. Cheng et al., Proc. SPIE Vol. 4000 (2000), p. 818.

As semiconductor designs are driven at the extreme edge of what is physically possible in optical lithography, even very small lens aberrations may affect the process windows and therefore manufacturing yield of devices. Moreover, small changes of aberrations over time or differences between different projection systems may suddenly and unexpectedly push certain designs into failing. It is well known that different lens aberrations have characteristic signatures that may be emphasized by particular pattern types. For example, astigmatism causes a shift in best focus between horizontal and vertical features, or between diagonal features having mutually orthogonal orientation. Using an arrangement of horizontal, vertical, and diagonal patterns, e.g., line space patterns, and determining the best focus position for each pattern type will allow for very fast characterization of two lens aberrations: astigmatism and 45-degree astigmatism.

Other particular pattern types may highlight other types of aberration; it is known for example that brick-wall patterns are particularly sensitive to three-wave aberration. See U.S. Pat. No. 6,787,789, "Method of Measuring Aberration of a Projection System of a Lithographic Apparatus, Device Manufacturing Method, and Device Manufactured Thereby." This means if this aberration is present, a brick-wall test pattern that has rectangular features placed on a hexagonal grid will show particularly large degradation of its aerial image quality.

Using a suitable test pattern, the methods of statistical aerial image sampling described above may be utilized to map the variation of image quality as a result of particular aberrations over the exposure field or slit width. The fast real-time data acquisition of the method will enable characterizing changes of the underlying parameters over time, as they may arise from lens heating, adjustments, or component aging.

Lithographic imaging processes are often characterized by a "coherence" or "optical proximity" curve that plots CD values vs. a variation of pitch in a line/space pattern of fixed mask line width. See "What Makes a Coherence Curve Change," S. P. Renwick, Proc. SPIE (2005). The behavior of these is largely affected by illuminator settings and the clipping of diffraction orders in the pupil of the projection system. A line-space pattern on the mask acts as a diffraction grid that maps the illuminator profile into the positive and negative first diffraction orders, whose interference with the zero order at the image plane produces image contrast. With decreasing pitch (i.e., narrower line spacing), the nonzero diffraction orders move outward in the pupil plane and start being clipped by the finite numerical aperture of the projection lens. As a result, image contrast as well as total image intensity decrease with decreasing pitch.

CD measurements on test wafers are a very indirect way of detecting these changes. They mostly record changes that occur near the resist sensitivity threshold, but are largely insensitive to changes in image maximum and minimum intensity (which define the contrast), and cannot directly measure total image intensity. Furthermore, resist CDs are influenced by the resist's properties and a wide range of processing effects. On the other hand, aerial image data that are recorded with linear photo-detectors will show more directly any effects that change image mean, minimum, or maximum levels, and these can be easily derived from a statistical evaluation. A test mask having line-space patterns with a variety of pitch values, possibly also having a variety of orientations, may effectively be used to gather information on the illumination profile or the intensity distribution in the pupil plane.

Similar to sensitivities of certain aberrations to particular pattern types, certain image patterns—besides line/space grids—are known to "resonate" with certain illumination profiles. Therefore, changes to the illumination settings will lead to detectable changes in image characteristics for suitably designed test patterns.

As in other applications proposed here, statistical sampling and image analysis can provide characterization of tool changes in real time. This may be utilized for efficient characterization and monitoring of intended changes by adjustments or unintended drifts of parameters over time.

Flare, or stray light, occurs in a projection system as a result of multiple light scattering, reflections, etc., and it is a major contributor to across-chip line width variation (ACLV). The overall effect of flare is to redistribute light and move intensity from bright features into dark areas, where flare occurs as an increased background. Therefore, image contrast would seem to be the most suitable measure to detect and characterize flare—however, image contrast can not be conveniently measured in any of the documented resist-based methods. See "Flare and its Effect on Imaging," S. P. Renwick, Proc-SPIE Vol. 5377 (2004); see also "Size-Dependent Flare and its Effect on Imaging," S. P. Renwick, S. D. Slonacker, and T. Ogata, Proc-SPIE Vol. 5040 (2003). Generally, flare has to be characterized by its magnitude as well as its range dependence, i.e., as a spectrum vs. spatial frequency. Three different spatial ranges are commonly distinguished: short-range, up to about 1 um; "local" between 2-10 um; and long-range from several tens of microns. Long-range mostly leads to an almost constant DC offset, while "local" flare appears to have the biggest impact on CD variations resulting from pattern density variations across a mask. A number of methods to characterize flare have been described in the literature that are based on exposing, developing, and inspecting test features on test wafers.

Aerial image sampling with an image sensor array provides a large variety of more direct ways to detect and characterize flare. For example, the possibility to measure accurately signal background level by statistical sampling in nominally dark areas has been discussed above. Such a measurement would provide a characterization of long-range flare, which can also be mapped over the exposure field. Unlike the known resist-based methods using particular flare test patterns, the aerial image based method is fundamentally capable of characterizing flare in the projection of arbitrary production masks, if a sufficient number of sufficiently large areas can be identified in the mask design.

A straightforward way of measuring local flare by statistical image sampling would utilize test patterns of equal line/space with pitch varying between a few 100 nm to a few tens of microns, and directly measure image contrast, e.g., as the width of a sample value histogram as a function of pitch or spatial frequency. This follows the method described in "Analysis of Flare and its Impact on Low-k1 KrF and ArF Lithography," B. La Fontaine, et al. Proc. SPIE, Vol. 4691, p. 44 (2002), and the data would allow reconstructing the modulation transfer function (MTF) of the system over the range of spatial frequencies that characterize and are most affected by local flare. Capturing image contrast with an image sensor array will be significantly more efficient and accurate, and avoids the drawbacks and uncertainties of resist-based evaluation. The latter involve, e.g., influences of resist and processing parameters and their possible variations across a mask or across a wafer, subjectivity in determining appearance and disappearance of features in resist, etc.

A different approach could use test patterns having a dark field box of varying size d, surrounded by a large bright area (the tones could also be reversed). This is similar to a resist-based test, where the exaggerated exposure dose is determined at which the box feature disappears. This level as a function of box size characterizes the spatial dependence, i.e., range, of local flare. As all resist-based flare measurement methods, it is affected by various processing effects, slow data acquisition time, and limited accuracy. An image array sensor approach can use a repeated test pattern having, e.g., a line-space pattern of fixed dimensions but pseudo-random phase, being sampled by an image sensor array in order to determine image contrast, high level and low level of the image. Limiting this test pattern by box-like openings of varying size—e.g., from about 2 um to tens of microns—in a large, clear surrounding area will lead to a variation of contrast as a function of box size. This variation would characterize the level as well as spatial range of local flare.

Figure 12A:
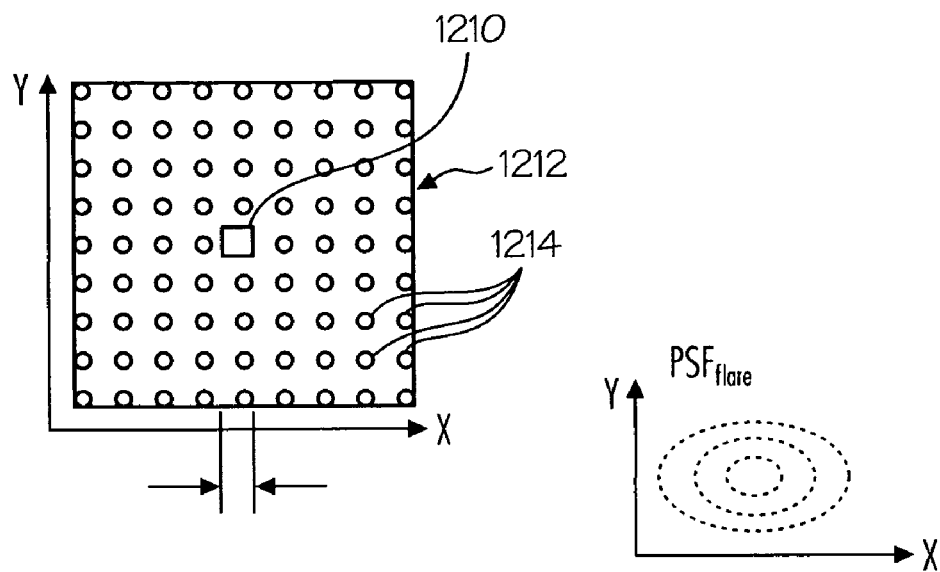
FIG. 12A is an illustration of data acquisition method for 2-dimensional sampling of stray light distribution around a test source using a single set of sampling locations, according to the invention.
Figure 12B:
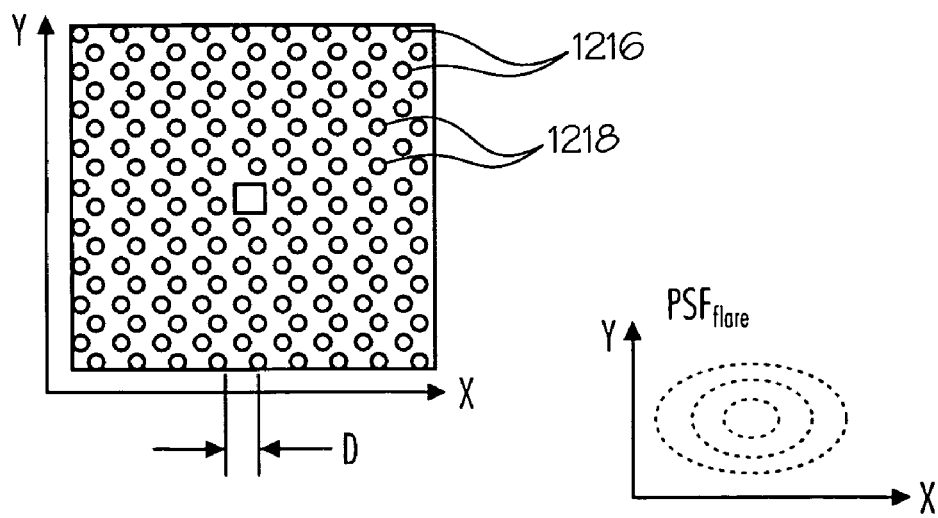
FIG. 12B is an illustration of data acquisition method for 2-dimensional sampling of stray light distribution around a test source using two interleaved sets of sampling locations, according to the invention.

With reference to FIG. 12A, a method of characterizing flare by measuring a 2-dimensional distribution uses isolated test features, e.g., an isolated bright "spot" 1210 of, e.g., 1×1 um size surrounded by a larger dark area 1212, in which the distribution of stray light is directly sampled by an image sensor array 1214. The bright source may or may not be overexposed if it falls on one or several image sensor elements. There is no deterministic fine alignment assumed between test feature 1210 and image sensor array 1214. Due to the nature of flare it can be expected that the stray light distribution is symmetrical in x and y direction, or completely rotationally invariant. Therefore, the exact source location can be determined from fitting a 2-dimensional distribution, e.g., Gaussian, to the sampled stray light values. If test feature 1210 is repeated over the mask, data from many sampling sub-areas (i.e., one test feature surrounded by a finite range of sampling locations) can be individually centered, interpolated and then averaged in order to increase SNR. In addition, if it is desired to increase the sampling density and therefore the intrinsic spatial resolution, sampling is possible with interleaved sets of sampling locations 1216, 1218 in subsequent exposures, as shown in FIG. 12B. From data collected in this way, a complete 2-dimensional point spread function characterizing local flare may be constructed, which is schematically drawn in the lower right of FIGS. 12A and 12B.

In discussing the application examples above, the ability to detect changes of characteristics representative of image quality over time in differential measurement mode has been pointed out. For tool characterization and verification, the ability to record short term changes in real time and analyze them very quickly may be very attractive.

The fast data acquisition time also enables detailed longer term trend monitoring of various measurement parameters. Since only a few exposures are required to extract data, the data acquisition would have minimal impact on a production schedule in device fabrication. Data can easily be taken on a daily, hourly, or per-shift basis in order to proactively detect trends, e.g., degradation in imaging performance before such trends become yield affecting. Furthermore, using a wafer-based image sensor array and test masks that can easily be transferred between different exposure tools enables a manufacturer to compare or match different tools based on common and completely equivalent measurements.

Besides variation of exposure tool performance over time, this approach may also monitor gradual changes and degradations of production masks. Image statistics of a production mask, based for example on histograms and ROIs, may be interpreted as a "fingerprint" of the particular mask layout. Changes to mask quality can occur over time as a result of gradual contamination, such as "haze" formation or "crystal growth," and may lead to overall gradual changes in the corresponding image contrast. In order to distinguish between tool and mask effects, a dedicated reference mask may be used to characterize the tool separately, or as a cross check against production masks.

The invention has been described above with reference to specific embodiments. It will, however, be evident that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A method for characterizing aerial image quality in a lithography system, comprising:
   measuring light intensity, using an image sensor array, at a number of samples of statistically-determined, non-adjacent locations within an aerial image produced by a lithography system without obtaining a number of measurements sufficient to reconstruct a complete feature of the aerial image; and
   using the samples of measured light intensity to determine a characteristic representative of the quality of the entire aerial image.

2. The method of claim 1, wherein the aerial image includes a quasi-regular repeatable pattern of features.

3. The method of claim 1, wherein the image sensor array includes a plurality of apertures and a diameter of each of the plurality of apertures is less than a minimum pitch of patterns of the aerial image.

4. The method of claim 1, wherein the characteristic representative of the quality of the entire aerial image is focus.

5. The method of claim 1, wherein the characteristic representative of the quality of the entire aerial image is contrast.

6. The method of claim 1, wherein the characteristic representative of the quality of the entire aerial image is flare.

7. The method of claim 1, wherein the characteristic representative of the quality of the entire aerial image is aberrations.

8. The method of claim 1, wherein the characteristic representative of the quality of the entire aerial image is focal plane tilt.

9. The method of claim 1, further comprising:
   using the samples of measured light intensity to determine a characteristic representative of the quality of a region of interest in the aerial image without reconstructing a complete feature of the aerial image.

10. A method for characterizing aerial image quality in a lithography system, comprising:
    measuring light intensity, using an image sensor array, at a single set of non-adjacent locations within an aerial image produced by a lithography system, the measured light intensity being obtained without translation of the image sensor array; and
    using the measured light intensity to determine a characteristic representative of the quality of the entire aerial image without the need to graphically reconstruct an entire feature of the aerial image.

11. The method of claim 10, further comprising:
    changing at least one setting of the lithography system;
    measuring light intensity, using the image sensor array, at a second set of locations within the aerial image produced by the lithography system; and
    using the measured light intensity at the second set of locations to determine the characteristic representative of the quality of the entire aerial image.

12. The method of claim 10, further comprising:
    using the samples of measured light intensity to determine a characteristic representative of the quality of a region of interest in the aerial image.

13. The method of claim 10, wherein the characteristic representative of the quality of the entire aerial image is focus.

14. The method of claim 10, wherein the characteristic representative of the quality of the entire aerial image is contrast.

15. The method of claim 10, wherein the characteristic representative of the quality of the entire aerial image is focal plane tilt.

16. The method of claim 10, wherein the characteristic representative of the quality of the entire aerial image is flare.

17. The method of claim 10, wherein the characteristic representative of the quality of the entire aerial image is aberrations.

18. A method for characterizing aerial image quality in a lithography system, comprising:
   placing an image sensor array in a lithography tool, the image sensor array having a plurality of apertures of equal diameter;
   illuminating a mask to produce an aerial image projected onto the image sensor array;
   measuring light intensity using the image sensor array at a first set of locations within the aerial image;
   moving the image sensor array a distance greater than the aperture diameter such that the plurality of apertures are at a second set of locations;
   measuring light intensity using the image sensor array at the second set of locations; and
   using the measurements of light intensity at the first set of locations and the measurements of light intensity at the second set of locations to determine a characteristic representative of the quality of the entire aerial image,
   wherein the measurements of light intensity at the first set of locations and the measurements of light intensity at the second set of locations are not sufficient to graphically reconstruct a complete feature of the aerial image.

19. A system for characterizing aerial image quality in a lithography system, comprising:
   an image sensor array capable of being loaded into a lithography tool, the lithography tool configured to project an aerial image onto the image sensor array;
   a data storage module capable of receiving and storing measurements of light intensity from the image sensor array; and
   an image characterization module configured to receive stored measurements of light intensity from the data storage module and to determine a characteristic representative of the quality of the entire aerial image using measurements of light intensity measured by the image sensor array at a statistically-determined sample of non-adjacent locations within the aerial image;
   wherein the image characterization module is configured to determine the characteristic representative of the quality of the entire aerial image using a fewer number of measurements than would be required to reconstruct a complete feature of the aerial image.

20. The system of claim 19, wherein the image sensor array includes a plurality of apertures and a diameter of each of the plurality of apertures is less than a minimum pitch of patterns of the aerial image.

21. A system for characterizing aerial image quality in a lithography system, comprising:
   an image sensor array capable of being loaded into a lithography tool, the lithography tool configured to project an aerial image onto the image sensor array;
   a data storage module capable of receiving and storing measurements of light intensity from the image sensor array; and
   an image characterization module configured to receive stored measurements of light intensity from the data storage module and to determine a characteristic representative of the quality of the entire aerial image using measurements of light intensity of less than the entire aerial image measured by the image sensor array;
   wherein the image characterization module is configured to determine the characteristic representative of the quality of the entire aerial image using fewer measurements than would be required for extracting an entire feature of the aerial image.

22. The system of claim 21, further comprising:
   a mask having test pattern features laid out on a regular grid.

* * * * *